United States Patent
Canham

[19]
[11] Patent Number: 5,914,183
[45] Date of Patent: Jun. 22, 1999

[54] POROUS SEMICONDUCTOR MATERIAL

[75] Inventor: Leigh Trevor Canham, Malvern, United Kingdom

[73] Assignee: The Secretary of State for Defence in Her Brittanic Majesty's Government of the United Kingdom of Great Britain and Northern Ireland, Hants, United Kingdom

[21] Appl. No.: 08/640,798
[22] PCT Filed: Nov. 17, 1994
[86] PCT No.: PCT/GB94/02531
§ 371 Date: Jun. 5, 1996
§ 102(e) Date: Jun. 5, 1996
[87] PCT Pub. No.: WO95/16280
PCT Pub. Date: Jun. 15, 1995

[30] Foreign Application Priority Data

Dec. 6, 1993 [GB] United Kingdom .................. 9324963
Sep. 12, 1994 [GB] United Kingdom .................. 9418341

[51] Int. Cl.$^6$ .................. B32B 3/26; F26B 5/04; H01L 21/02; H01L 31/12
[52] U.S. Cl. .................. 428/312.6; 34/350; 34/405; 205/656; 216/16; 257/82; 257/84; 257/103; 428/319.1; 438/705; 438/753; 438/960; 438/962
[58] Field of Search .................. 428/312.8, 319.1, 428/312.6; 34/350, 405; 257/3, 82, 84, 103, 347; 437/233, 241, 243; 205/656; 216/16; 438/705, 753, 960, 962

[56] References Cited

U.S. PATENT DOCUMENTS 5,348,618  9/1994  Canham et al. .................. 156/644
5,358,600 10/1994  Canham et al. .................. 156/644

FOREIGN PATENT DOCUMENTS

WO 91/09420  6/1991  WIPO.

OTHER PUBLICATIONS

Applied Physics Letters, vol. 63, No. 13, pp. 1830–1832, J.S. Fu et al. "Gamma–rya irradiation: An effective method for improving light emisssion stability of porous silicon", Sep. 1993.
Applied Physics Letters, vol. 62, No. 10, pp. 1155–1157, I.Sanges et al. "Optical absorption evidence of a quantum size effect in porous silicon", Mar. 1993.
Journal of the American Ceramic Society, vol. 75, No. 8, pp. 2027–2036, J.Fricke et al. "Aerogels", Aug. 1992.
Patent Abstracts of Japan, vol. 15, No. 334 (E–1104), Aug. 1991.
Journal of Crystal Growth, vol. 73, pp. 622–636, pp. 622–636, M. Beale et al. "An experimental and theoretical study of the formation and microstructure of porous silicon", Jan. 1985.
Nature, vol. 368, pp. 133–135, L. Canham et al. "Luminescent anodized silicon aerocrystal networks prepared by supercritical drying", Mar. 1994.
Badoz, P. A. et al., "Characterization of Porous Silicon: Structural, Optical and Electrical Properties", Mgt. Res. Soc. Symp. Proc., vol. 283, 1993 Materials Research Society, pp. 97–108.

Primary Examiner—Blaine R. Copenheaver
Attorney, Agent, or Firm—Nixon & Vanderhye P.C.

[57] ABSTRACT

Porous semiconductor material in the form of at least partly crystalline silicon is produced with a porosity in excess of 90% determined gravimetrically, and voids, crazing and peeling are substantially not observable by scanning electron microscopy at a magnification of 7,000. The porous silicon is dried by supercritical drying. The silicon material has good luminescence properties together with good morphology and crystallinity.

33 Claims, 5 Drawing Sheets

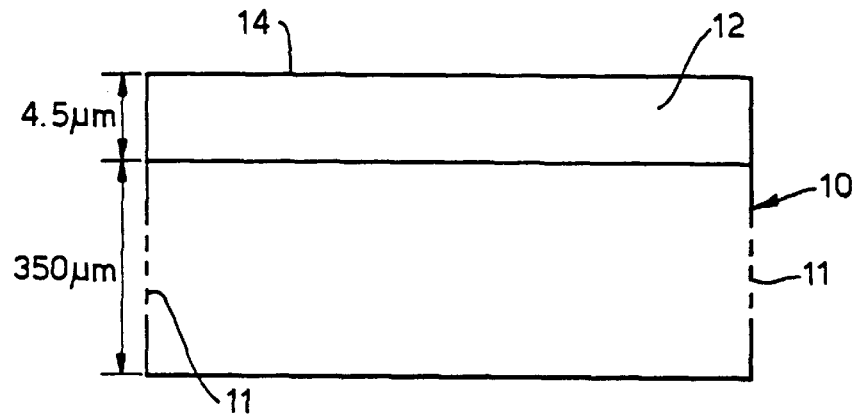
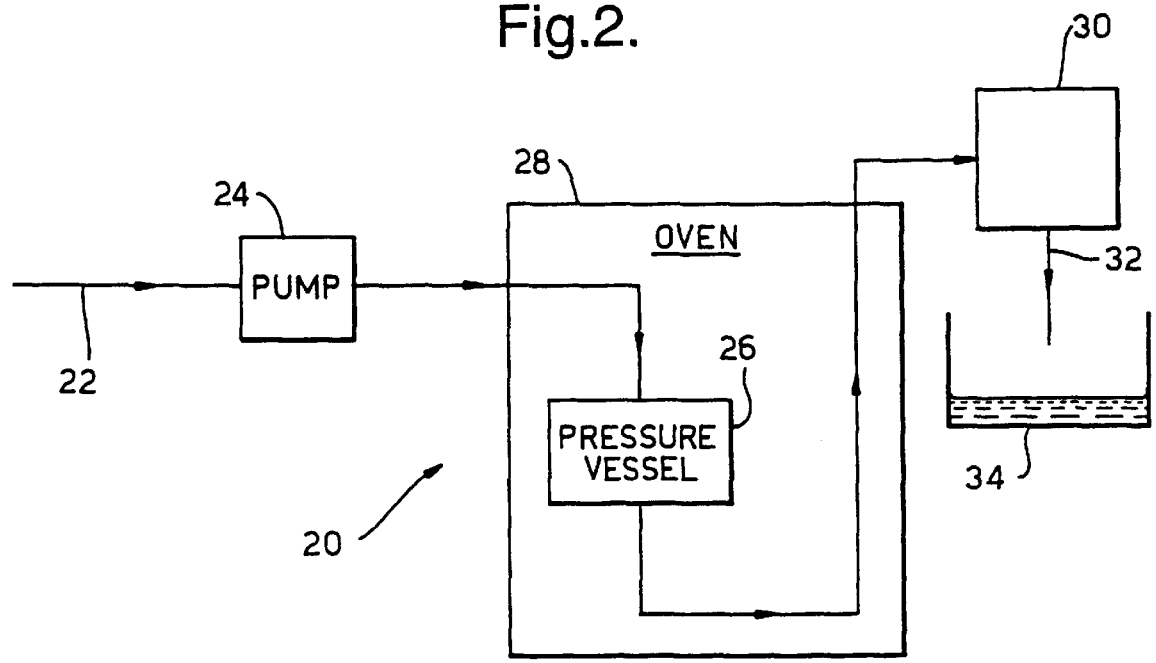

POROUS SEMICONDUCTOR MATERIAL

BACKGROUND OF THE INVENTION

1. Field of the Invention

This invention relates to porous semiconductor material such as silicon in particular, although not exclusively, to methods of producing such material and to devices incorporating it.

2. Discussion of Prior Art

In recent years great interest and considerable research and development activity has been generated in response to the discovery of visible luminescence at room temperature from porous silicon. There have been a substantial number of publications in the scientific literature and also patent applications. See for example the 1992 Fall Meeting of the Materials Research Society, the symposium being entitled "Microcrystalline Semiconductors..Materials Science and Devices", Nov. 30 to Dec. 4 1992. International Patent Applicant No PCT/GB90/01901 published as WO 91/09420 relates to porous silicon having luminescent properties by virtue of its containing silicon quantum wires. Bulk (ie non-porous) silicon has very poor luminescence efficiency because it has indirect gap band structure. Highly porous silicon containing silicon quantum wires has much greater luminescence efficiency, and the luminescence emission is of shorter wavelength. Luminescence is associated with quantum confinement of charge carriers within quantum wires of which the porous silicon is composed.

Experience has shown that the luminescence properties of porous silicon improve both with increasing porosity and with increasing resistivity of the original p-type bulk silicon starting material from which the porous silicon is produced. However, the structural properties of conventionally produced porous silicon degrade with both increasing porosity and increasing starting material resistivity. In Appl. Phys. Lett. Vol 60 (18), pages 2285–2287, May 4, 1992, Friedersdorf et al. discuss the influence of stress on porous silicon luminescence. They show in FIG. 2 an optical micrograph of porous silicon exhibiting "cellular structure", this being the crazing and cracking of porous silicon material. A substantial degree of delamination or peeling of the porous silicon occurs. This makes high porosity porous silicon structurally unsuitable for luminescent device applications. It is too mechanically weak at porosities high enough to provide useful luminescence. Experience shows that porous silicon produced in accordance with International Patent Application No PCT/GB90/01901 begins to exhibit crazing and partial disintegration at porosities above 90% for bulk silicon starting material of resistivity not greater than $10^{-2}$ ohm cm ($p^+$ type) and porous layer thickness of 4 $\mu$m or greater. Here the porosity is determined gravimetrically assuming no shrinkage during production. The situation is worse with higher resistivity p type silicon starting material ($p^-$, 1 ohm cm). Here crazing and partial disintegration occur at gravimetric porosities above 80% and layer thicknesses similar to the $p^+$ equivalents.

Difficulties in producing high porosity silicon are also shown by Lehmann et al., Mat. Res. Soc. Symp. Proc. Vol. 283, pages 27–32, 1993. FIG. 6 of this article demonstrates crack evolution and shrinkage during production. Similar effects were also mentioned in a paper by Beale et al. J. Cryst. Growth, Vol. 73, p622 onwards 1985. This paper describes low density porous silicon films which craze and peel during production. In a very recent paper by Grivickas et al., Thin Solid Films, Vol 235, p.234, 1993, it is stated that the thickest porous silicon films broke off from the substrate and disintegrated into small pieces. It is consequently a long felt want to provide high porosity semiconductor material such as silicon with good structural characteristics.

Luminescent porous silicon layers having thicknesses in the range 20 $\mu$m to 80 $\mu$m are described by Badoz et al. in the Materials Research Society Syposium Procedings, Volume 283, 1993, pages 97 to 108. Similar porous slicon material is reported by Sagnes et al. in Applied Physics Letters, Volume 62(10), 1993, pages 1155–1157. Prior art techniques for the fabrication of thick luminescent porous silicon layers are known to result in structures in which only a top layer of the porous silicon is luminescent.

SUMMARY OF THE INVENTION

It is an object of the invention to provide porous semiconductor material of improved structure and a method of making it.

The present invention provides porous semiconductor material which is at least partly crystalline, characterized in that the semiconductor material has a porosity in excess of 90% determined gravimetrically and in which voids, crazing and peeling are substantially indiscernible by scanning electron microscopy at a magnification of 7,000.

The invention provides the advantage that the material is of much higher structural quality than in the prior art of high porosity crystalline semiconductor materials.

In a preferred embodiment, the porous semiconductor material comprises an aerocrystal of porous silicon material connected to a non-porous crystalline silicon substrate, and is at least 80% crystalline, has a thickness constant to within 10% and contains silicon quantum wires with diameters of less than 4 nm; at least 90% by volume of the porous silicon preferably consists of a reticulated structure of silicon quantum wires, and at least 50% of the said wires preferably have diameters of less than 4 nm. The porous silicon material is preferably activatable to produce visible luminescence.

The invention further provides porous semiconductor material, characterized in that the porous semiconductor material comprises an aerocrystal of greater than 90% porosity connected to a substantially non-porous substrate of like material and crystal structure, and that part of the aerocrystal has a refractive index less than 1.1.

The invention also provides porous semiconductor material which is at least partly crystalline, characterized in that the semiconductor material has a porosity in excess of 90% determined gravimetrically and has a crack density of less than $10^8$ cm$^{-2}$.

In a further aspect, the invention provides porous semiconductor material, characterized in that the porous semiconductor material comprises an aerocrystal of greater than 90% porosity connected to a substantially non-porous substrate of like material and crystal structure, the material being free of cracks greater than 0.1 $\mu$m in width.

The invention also provides porous semiconductor material which is at least partly crystalline, characterized in that the semiconductor material has a porosity in excess of 90% determined gravimetrically and in which voids, crazing and peeling are substantially indiscernible by scanning electron microscopy at a magnification of 7,000 of an area of at least 20 $\mu$m×10 $\mu$m.

In another aspect, the invention provides porous semiconductor material which is at least partly crystalline, characterized in that the semiconductor material has a porosity in excess of 90% determined gravimetrically and is free of cracks greater than 0.1 $\mu$m in width.

In another aspect, the invention provides a luminescent device incorporating porous semiconductor material which is at least partly crystalline and activatable to produce visible luminescence, characterized in that the porous semiconductor material has a porosity in excess of 90% determined gravimetrically and in which voids, crazing and peeling are substantially indiscernible by scanning electron microscopy at a magnification of 7,000, the device also incorporating means for exciting luminescence from the porous semiconductor material.

In the luminescent device of the invention, the porous silicon material is preferably connected to a non-porous crystalline silicon substrate, and is at least 80% crystalline, has a thickness constant to within 10% and contains silicon quantum wires with diameters less than 4 nm; at least 90% by volume of the porous silicon preferably consists of a reticulated structure of silicon quantum wires, and at least 50% of the said wires preferably have diameters less than 4 nm. The porous silicon material is preferably activatable to produce visible luminescence.

The invention further provides a luminescent device incorporating porous semiconductor material which is at least partly crystalline and activatable to produce visible luminescence, characterized in that the porous semiconductor material has a porosity in excess of 90% determined gravimetrically and in which voids, crazing and peeling are substantially indiscernible by scanning electron microscopy at a magnification of 7,000 of an area of at least 20 $\mu$m×10 $\mu$m, the device also incorporating means for exciting luminescence from the porous semiconductor material.

In a further aspect, the invention provides a method of making porous semiconductor material incorporating the step of producing porous semiconductor material which is liquid-wetted and at least partly crystalline, characterized in that the method further incorporates the step of drying the porous semiconductor material by a supercritical drying process.

In the method of the invention, the step of producing porous semiconductor material which is liquid-wetted and at least partly crystalline preferably comprises producing porous semiconductor material which is porous silicon material with a porosity in excess of 90% determined gravimetrically and which is at least partly crystalline (preferably at least 80%).

The invention further provides porous semiconductor material having a porosity of greater than 70% over a sheet thickness greater than 10 $\mu$m and which is activatable to produce visible luminescence, characterized in that the material exhibits only a single layer structure under cross-sectional scanning electron microscopy analysis and that more than 50% by thickness of the porous semiconductor material is luminescent.

The invention also provides porous semiconductor material activatable to produce visible luminescence and having a sheet thickness greater than 20 $\mu$m, characterized in that more than 80% of the porous semiconductor material has a luminescence efficiency of greater than 0.1%.

The invention further provides porous semiconductor material activatable to produce visible luminescence and having a sheet thickness greater than 10 $\mu$m, characterized in that voids, crazing and peeling are substantially indiscernible by scanning electron microscopy at a magnification of 7,000 and that more than 50% by thickness of the porous semiconductor material is luminescent.

In addition, the invention provides porous semiconductor material activatable to produce visible luminescence, characterized in that the porous semiconductor material has a sheet thickness greater than 100 $\mu$m and that more than 50% by thickness of the porous semiconductor material is luminescent.

The invention also provides a luminescent device incorporating porous semiconductor material of sheet thickness greater than 10 $\mu$m and which is activatable to produce visible luminescence, characterized in that the material exhibits only a single layer structure under cross-sectional scanning electron microscopy analysis and that more than 50% by thickness of the porous semiconductor material is luminescent.

BRIEF DESCRIPTION OF THE DRAWINGS

In order that the invention might be more fully understood, examples thereof will now be described, with reference to the accompanying drawings, in which:

FIG. 1 schematically shows a silicon substrate wafer and a porous silicon layer thereon;

FIG. 2 schematically shows apparatus for supercritical drying;

DETAILED DISCUSSION OF PREFERRED EMBODIMENTS

Figure 3:
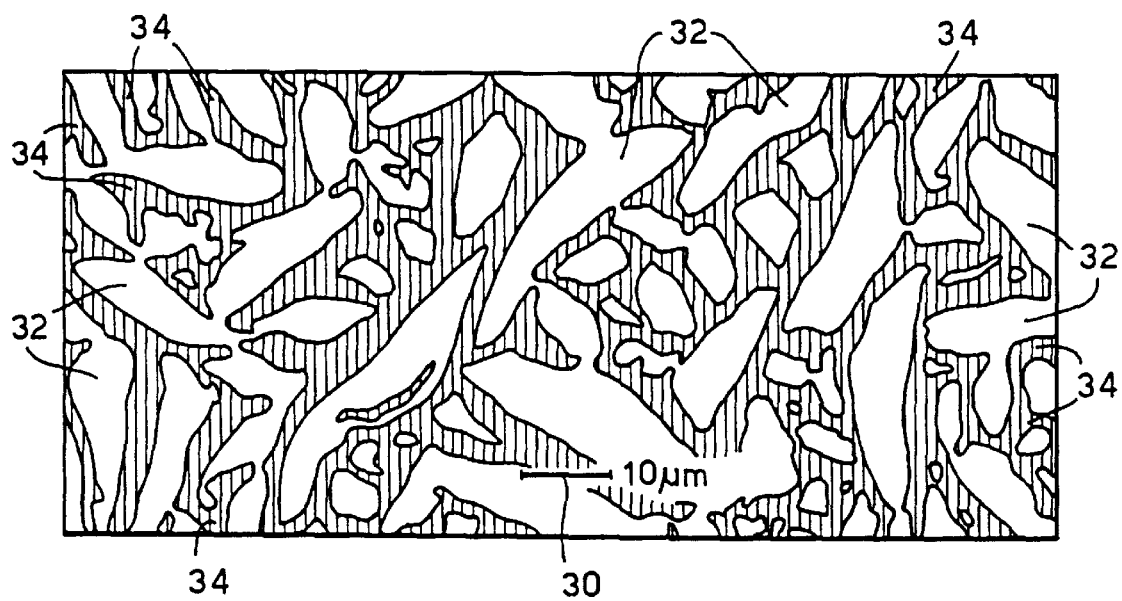
FIGS. 3 to 6 are drawings produced from scanning electron microscope photographs of porous silicon material dried in air and dried by a supercritical drying process.

Referring to FIG. 1, a Czochralski-grown (cz) single crystal silicon wafer 10 350 $\mu$m in thickness is shown in section. Chain lines 11 indicate that the wafer 10 is illustrated on a reduced scale. The wafer 10 has a surface layer 12 of porous silicon material thereon of 4.5 $\mu$m thickness. The layer 12 has an upper surface 14 remote from the wafer 10. Strictly speaking the expression "layer" is a misnomer, although it is often used in lithography.

The layer 12 was not "laid down"; it was produced electrochemically by an anodizing/etching process, ie anodization combined with etching. The wafer 10 was of heavily doped p-type (p$^+$) silicon material, with a resistivity in the range 5×10$^{-3}$ ohm cm to 15×10$^{-3}$ ohm cm.

The wafer 10 was anodized in what is referred to as "10% ethanoic" hydrofluoric acid (HF) solution; this produced small pores in the wafer 10, which was then subjected to etching by soaking in the same solution. The etching produced pore overlap defining silicon quantum wires. The ethanoic HF solution was produced from an aqueous solution of 20% by weight of HF in water, this solution being subsequently mixed with an equal volume of ethanol. The resulting mixture is referred to as 10% ethanoic HF solution.

Anodization of the wafer 10 was carried out in the 10% ethanoic HF solution at a current density of 50 mAcm$^{-2}$ for 3 minutes. An anodizing/etching apparatus was employed as described in International Patent Application No PCT/

GB90/01901 previously mentioned. This anodization produced a substantially uniform gold coloured porous layer (or stratum of porous silicon material) which is 4.5±0.5 μm in thickness. The layer had a porosity (void fraction) of 85%, ie its density was 15% that of non-porous crystalline silicon.

In accordance with the invention it is desired to produce a layer 12 with porosity of at least 90%. Moreover, it is desired that the layer 12 remain crystalline and continue to be supported by the non-porous substrate or wafer 10. In International Application No. PCT/GB90/01901 referred to above, a procedure is disclosed in which silicon is anodized and subsequently etched to increase porosity. However, it has been found that etching to a porosity in excess of 90% creates porous silicon, which, upon drying to remove the etchant, exhibits at least partial disintegration by cracks, crazing and peeling of the porous layer from the substrate.

The porous layer 12 was subjected to chemical dissolution (etching) for 30 minutes in 10% ethanoic HF solution (as used for anodization). This increased its porosity to an average value of 95% (measured by gravimetric analysis). The layer 12 was maintained in a wet state (ie wetted by the ethanoic HF etchant solution), and was transferred in this state to a bath of pure ethanol with etchant initially within its pores. The wafer 10 and layer 12 were cleaved under the ethanol to provide reduction to a size suitable for insertion within a pressure vessel. The cleaved wafer was then transferred to a pressure vessel of 50 ml volume. The wafer remained in an ethanol-wetted state during transfer, and the vessel itself was full of ethanol.

Referring now also to FIG. 2, there is shown in schematic form an apparatus 20 for supercritical drying of materials. The apparatus 20 incorporates a $CO_2$ input pipe 22 connected to a pump 24 with a chilled (8° C.) pump head (not shown). The pipe 22 connects the pump 24 to a $CO_2$ reservoir (not shown); the pump 24 is connected to a pressure vessel 26 within an oven 28. The vessel 26 is connected to a back pressure regulator 30 with an outlet 32 to an effluent receiver vessel 34.

In operation of the apparatus 20, the wafer was within the pressure vessel 26. The ethanol and residual electrolyte within the pores of the layer 12 was replaced by liquid $CO_2$ supplied to the pressure vessel 26 by means of the pump 24. The liquid $CO_2$ flushed the ethanol from the layer pores. It was pumped through the pressure vessel 26 at a flow rate of 2 $cm^3$ per minute, a temperature of 18° C. and a pressure of 1500 psi (10.1 MPa). The level of ethanol remaining in the layer pores was monitored by sampling and analysing effluent from the outlet 32. After flushing with liquid $CO_2$ for 3 hours, there was less than 10 ppm of ethanol in the effluent.

The pressure vessel 26 containing the wafer 10 immersed in liquid $CO_2$ was then subjected to increased temperature by means of the oven 28. The temperature within the vessel 26 was increased at 1° C. per minute to 40° C., and the pressure rose gradually to 2400 psi (16.2 MPa). At this point the $CO_2$ was a supercritical fluid, ie a fluid above its critical point. The pressure was then reduced to 1500 psi (10.1 MPa), and supercritical $CO_2$ was flushed through the pressure vessel 26 at 40° C. for 2 hours. Maintaining the pressure vessel temperature at 40° C., the $CO_2$ was slowly vented from the vessel 26 over a period of 16 hours reducing the pressure within the vessel to atmospheric. On removal from the vessel 26, the porous silicon layer was found to be substantially free of disintegration by cracks, peeling or crazing. It had a porosity (void fraction) of 95% as determined by gravimetric analysis. The specimen produced in this way is referred to as UHP 23A. The silicon wafer (in a wet state and with etched porous layer) from which UHP 23A was cleaved was dried by being allowed to stand in air as in the prior art. This wafer was then designated comparison specimen UHP 23.

Figure 4:
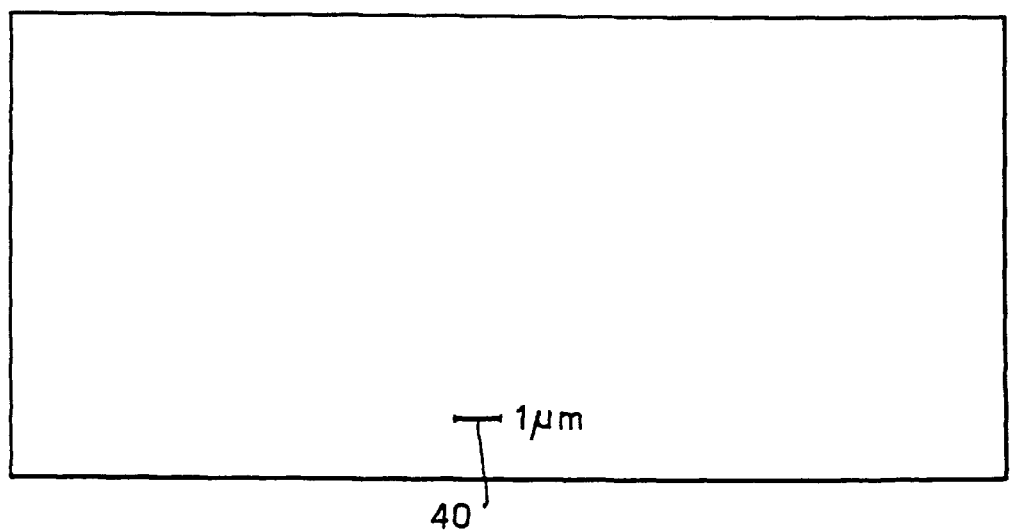

The morphologies of supercritically dried specimen UHP 23A and air dried comparison specimen UHP 23 were investigated as follows. A scanning electron microscope (SEM) was employed to study the upper surfaces of these specimens, ie the equivalents of the surface 14 in FIG. 1 remote from the wafer 10. FIGS. 3 and 4 are drawings reproduced from such micrographs for specimen UHP 23 and specimen UHP 23A respectively. FIG. 3 is reminiscent of fissured dried mud; it has a magnification in the region of $1.4 \times 10^3$; this is indicated by a line 36 having a length corresponding to 10 μm in physical distance. FIG. 3 shows that air dried specimen UHP 23 consists of regions of porous silicon such as 37 (unshaded) alternating with fissures such as 34 (shaded). The fissures 38 are of greater total surface area than the silicon regions 37, and are up to 8 μm in width. The silicon regions 37 are typically 2 μm to 5 μm in width. In contrast, FIG. 4 is a plain featureless scene; UHP 23A exhibited no recognisable cracks, fissures, or other morphology in the SEM photograph. In FIG. 4 a line 40 corresponds to a physical length of approximately 1 μm, indicating a magnification in the region of $7 \times 10^3$. FIG. 4 thus illustrates an area of porous silicon of approximately 20 μm×10 μm. In consequence, cracks less than 0.1 μm wide would have been visible if present. Specimen UHP 23A is therefore free of cracks greater than 0.1 μm in width.

Figure 5:
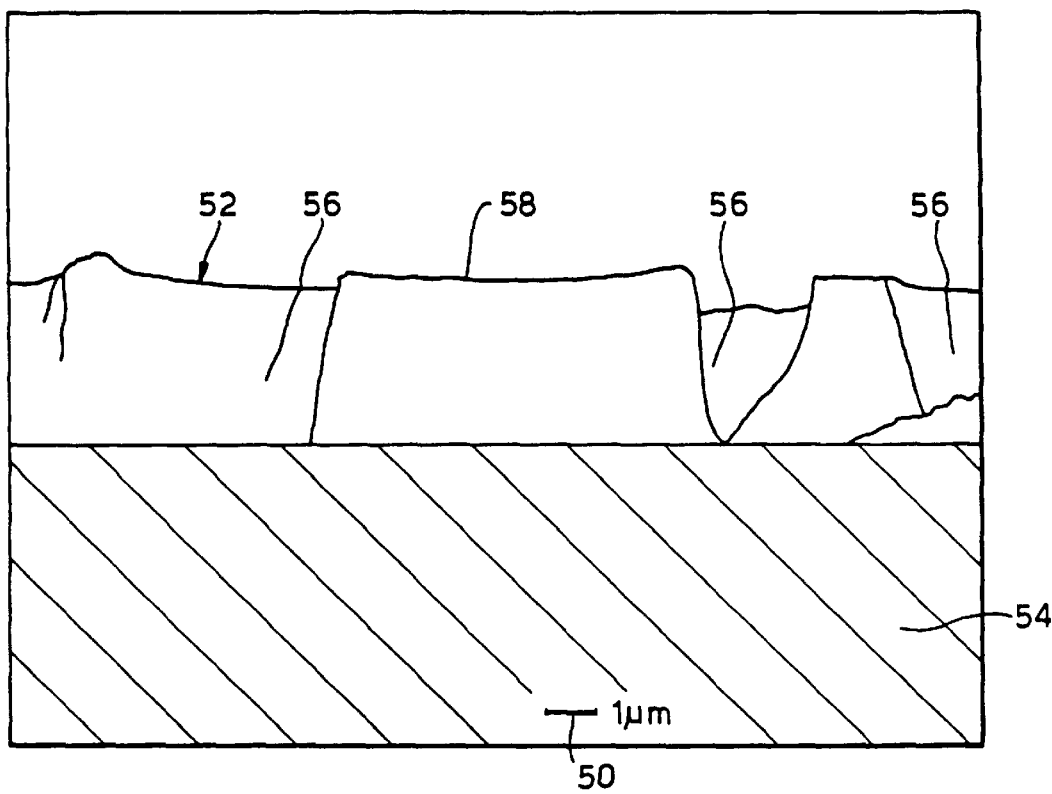
Figure 6:
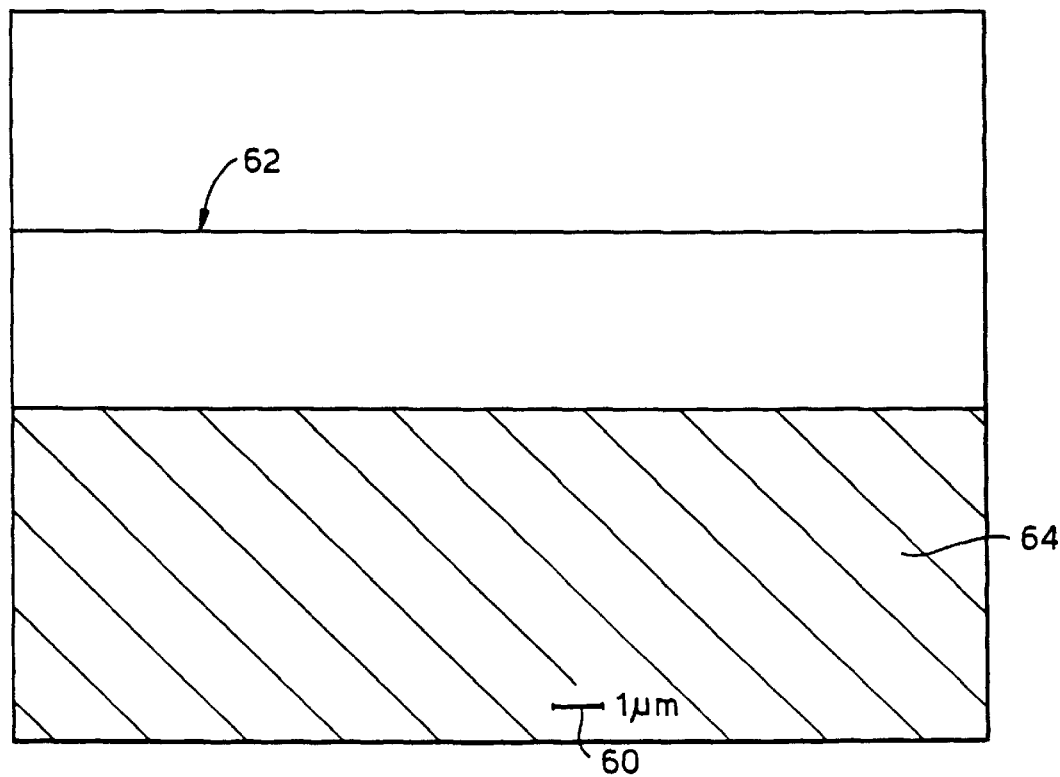

The specimens UHP 23 and UHP 23A were cleaved perpendicular to their upper surfaces (14 in FIG. 1), and SEM photographs were taken of the cleavage surfaces. FIG. 5 (UHP 23) and FIG. 6 (UHP 23A) were drawn from such photographs; they represent magnifications of about $7 \times 10^3$ as indicated by respective lines 50 and 60 corresponding to physical lengths of 1 μm. FIGS. 5 and 6 show porous silicon layers 52 and 62 upon respective wafer substrates 54 and 64. The layer 52 of the air dried specimen UHP 23A has substantial void or fissure regions 56, 2 μm and 5 μm across, interspersed with porous silicon material 58, 8 μm across. The layer 62 of the supercritically dried specimen UHP 23A has no visible voids or fissures and is of substantially constant thickness. This shows that supercritical drying has substantially obviated the shrinkage and cracking of prior art porous silicon. From the photographs used to prepare FIGS. 4 and 6, the crack density is less than $10^8$ $cm^{-2}$.

Figure 7:
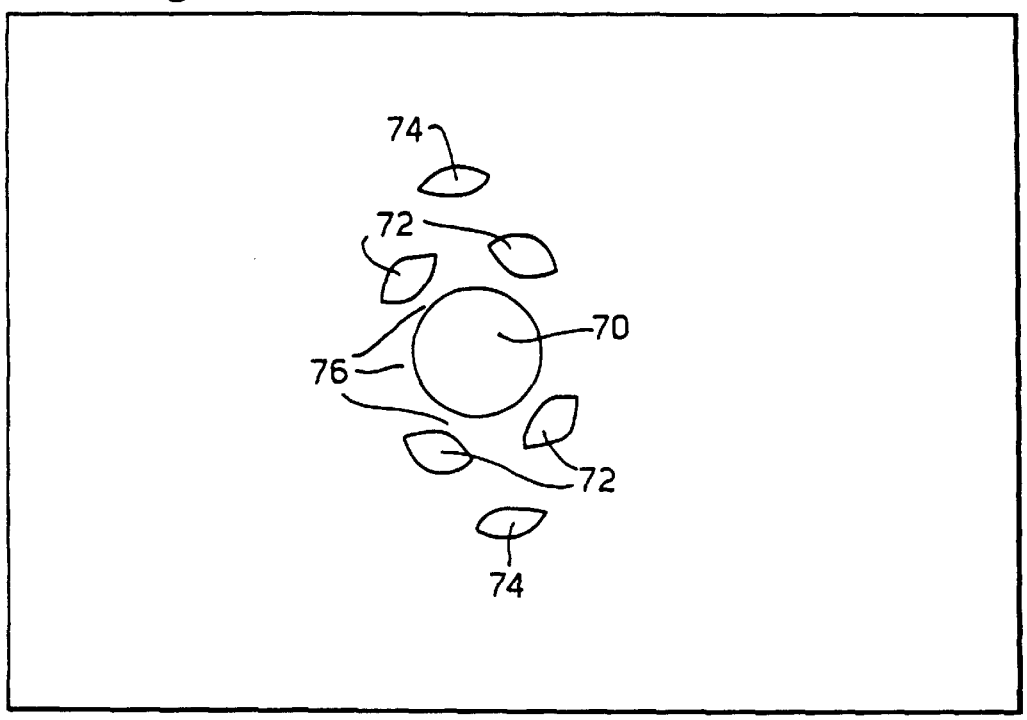
FIG. 7 is a drawing of a transmission electron diffraction pattern from porous silicon material produced in accordance with and of the invention.

In order to investigate the crystallinity of supercritically dried specimen UHP 23A, a transmission electron diffraction pattern was obtained using a 300 kV electron beam. Flakes of porous silicon were removed from UHP 23A and introduced into the electron diffraction instrument. FIG. 7 was drawn from the resulting photograph. It shows inter alia a central undiffracted beam 70 with four first order diffraction lobes 72. The lobes 72 are characteristic of the 110 orientation of crystalline silicon. Second order or (220) orientation lobes 74 are also shown. There is no evidence for the presence of randomly oriented crystallites, since there are no diffraction rings. In the photograph from which FIG. 7 was produced, there was a small amount of background intensity (not shown) in the region 76 between the central beam 70 and first order lobes 72. Such background can arise from a number of phenomena, one of which is the presence of amorphous material, in this case $SiO_2$. The background was sufficiently weak in intensity compared to the lobes 72 to show that the porous silicon layer 12 of UHP 23A was more than 80% crystalline silicon in single crystal form; ie more than 80% of the Si atoms in the porous layer were unoxidised and on crystal lattice sites. In fact, it is believed that more than 90% of the Si atoms were unoxidised and on silicon lattice sites. It is believed that this porous silicon preserved the crystal structure of the original silicon wafer 10, since there is no other reasonable mechanism for such a structure to arise. This is a surprising result, because the supercritically dried specimen UHP 23A comprised quantum wires of 3 nm to 5 nm diameter in air. The interatomic spacing in silicon is 0.235 nm, so 3 nm to 5 nm diameter quantum wires have only 12 to 21 atoms across a diameter of these at least the outermost atoms will not be on crystal lattice sites once they become oxidised. It is in fact surprising that the supercritically dried specimen UHP 23A was less than 10% oxidised, since it had been stored for one month between production and electron diffraction measurement.

In order to compare luminescent properties of porous silicon material produced in accordance with the invention with that produced by a prior art procedure, two further specimens, referred to as UHP 17 and UHP 26B respectively, were prepared. Specimen UHP 17 was produced as follows. A wafer of $p^+$ silicon material with resistivity in the range $5 \times 10^{-3}$ ohm cm to $15 \times 10^{-3}$ ohm cm was anodized in 10% ethanoic HF solution at a current density of 50 mAcm$^{-2}$ for 3 minutes. This wafer was then etched for 15 minutes by being left to soak in the same solution. It was subsequently rinsed in pure ethanol to remove etchant, and then dried in air. As a result of this processing, the wafer bore a porous silicon layer which had partly disintegrated by cracking and peeling. Detached flakes of the porous layer were imaged in a transmission electron microscope (TEM). The flakes proved to contain quantum wires with diameters in the range 4.5 nm to 6 nm. A porosity value can be quoted for this layer, but it would be of doubtful value because of the layer's partial disintegration.

A second wafer of $p^+$ silicon material with $50 \times 10^{-3}$ ohm cm to $50 \times 10^{-3}$ ohm cm was used to make specimen UHP 26B. The wafer was anodized for 5 minutes in 10% ethanoic HF solution at a current density of 50 mAcm$^{-2}$. It was then etched for 5 minutes by being left to soak in the same solution. Experience shows that the resulting porous silicon layer so produced on the wafer would craze and disintegrate substantially completely if dried in air. The original wafer was of higher resistivity than that used to make UHP 17, and increase in resistivity improves luminescence properties but also increases likelihood of disintegration.

Instead UHP 26B was dried by a supercritical drying process similar to that described earlier with reference to FIGS. 1 and 2. The wafer was soaked in ethanol to remove etchant from the pores of the porous silicon layer; it was then dried in a pressure vessel of 10 cm$^3$ capacity by replacing the ethanol with liquid CO$_2$ at a temperature of 18° C. and a pressure of 1500 psi (10.1 MPa).

The temperature was then raised to 40° C. over a 15 minute time interval and flushed with supercritical CO$_2$ for 15 minute time interval and flushed with supercritical CO$_2$ for 15 minutes. A one hour interval was employed for depressurization of specimen to UHP 26B to atmospheric pressure. After removal from the pressure vessel, this specimen exhibited no crazing, cracking or partial disintegration. It exhibited the same morphology as that described for specimen UHP 23A despite the relatively more rapid depressurization.

Figure 8:
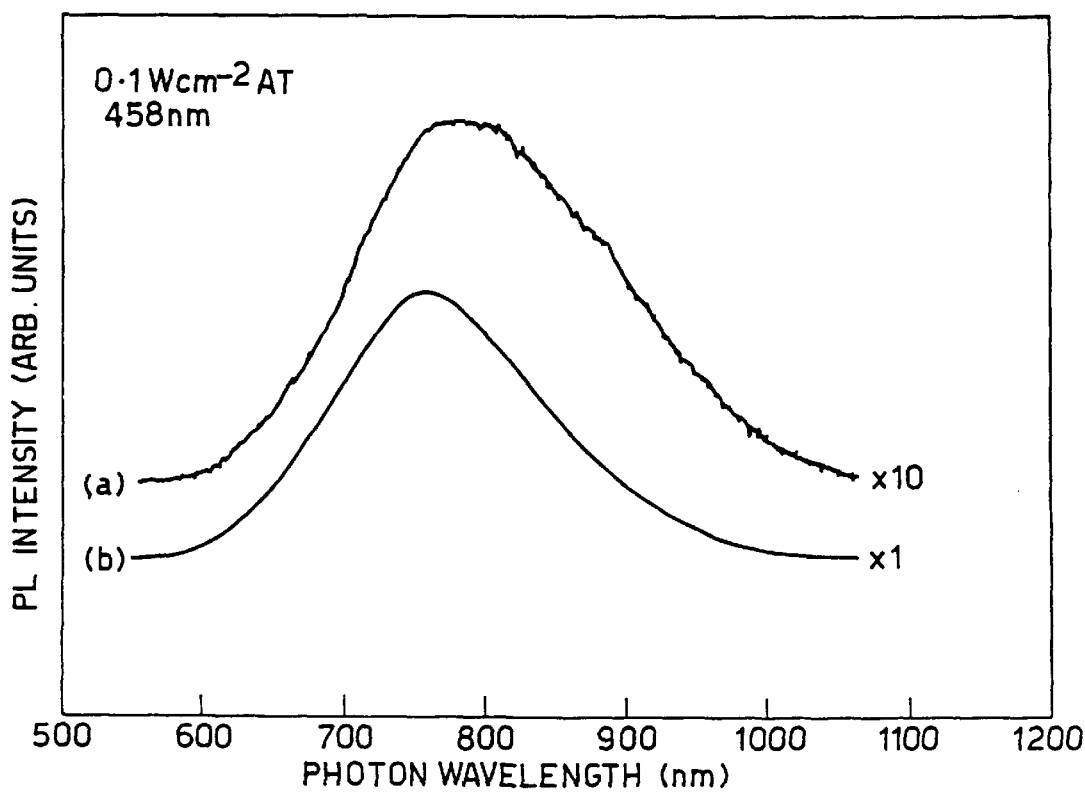
FIG. 8 shows photoluminescence spectra obtained from a porous silicon specimen of the invention and a comparison specimen.

Specimens UHP 17 and UHP 26B were tested for photoluminescence properties by being subjected to irradiation with 0.1 watt cm$^{-2}$ of argon ion laser radiation of 458 nm wavelength. This was carried out in air at ambient temperature. Specimen UHP 17 had undergone storage in air at ambient temperature subsequent to formation and prior to irradiation. The photoluminescence spectra are shown in FIG. 8, graphs (a) and (b) being those of Specimens UHP 17 and UHP 26B respectively. The ordinate axis is photoluminescence intensity (arbitrary units) and the abscissa axis is wavelength (nm). Graph (a) has been displaced vertically to avoid overlapping spectra; the graphs both go to zero at 550 nm (at which a relative shift has been introduced), and graph (a) has undergone a tenfold (×10) ordinate scale expansion or relative magnification compared to graph (b). This can be appreciated from the much greater noise level of graph (a) relative to that of graph (b).

The photoluminescence emission band of graph (a) is wider than that of graph (b). Moreover, graph (b) has a peak photoluminescence emission centred at about 757 nm, compared with about 778 nm for graph (a). Graph (b) is therefore blue-shifted slightly relative to graph (a), and has higher peak intensity having regard to the relative magnification of graph (a) previously mentioned. The integrated photoluminescence intensity (peak intensity multiplied by full width at half height) of graph (b) is six times that of graph (a). These differences are collectively consistent with specimen UHP 26B incorporating smaller quantum wires than specimen UHP 17, giving a higher degree of quantum confinement, and having higher quantum wire density. Calculations show that specimen UHP 26B exhibits a photoluminescence efficiency of greater than 0.1%. Furthermore, FIG. 8 is evidence that supercritical drying does not merely preserve the luminescence properties of porous silicon, but also provides enhancement of those properties. The combination of specimen UHP 26B and the activating Argon ion laser constitutes a luminescent device.

An example of the invention, specimen UHP 23C cut from the same wafer as UHP 23A, was used to investigate the morphology of material of the invention. Transmission electron microscopy (TEM) was used to study specimen UHP 23C; this specimen proved to contain silicon quantum wires with diameters less than 4 nm, and it consisted of a three dimensional reticulated structure of silicon quantum wires at least 50% of which were less than 4 nm in diameter. At least 90% of the silicon in this structure was in the form of silicon quantum wires.

The invention provides inter alia an electrochemical process for producing porous crystalline silicon material supported by and attached to a bulk (ie non-porous) silicon substrate, the porous silicon being initially in a wetted state and dried by a supercritical drying process. The invention provides crystalline porous silicon with luminescence properties; the porous silicon is attached to and is an extension of the crystal structure of non-porous crystalline silicon material from which the porous silicon was produced by removal of silicon material. The porous silicon is a three dimensional branched network of quantum wires in which the luminescence properties arise from quantum confinement of charge carriers. Luminescence properties of porous silicon are improved by increase in quantum confinement, which requires reduction in quantum wire diameter and therefore increase in porosity. At least in p$^+$ silicon, these properties are also improved by increased resistivity of the bulk silicon wafer used to produce the porous silicon material.

Porosity data quoted above was obtained for specimens UHP 23A and others by a gravimetric procedure described in International Application No. PCT/GB90/01901 previously mentioned. This procedure involves determining the weight of silicon lost in anodization and etching and calculating an average density for the porous silicon assuming it retains its pre-anodization shape. The porous silicon density is then divided by the density of bulk silicon, and the result is subtracted from unity to provide a porosity figure. The validity of this depends on the porous silicon preserving its shape. If there is shrinkage during drying, the actual porosity will be lower than that indicated by gravimetric data.

Figure 9:
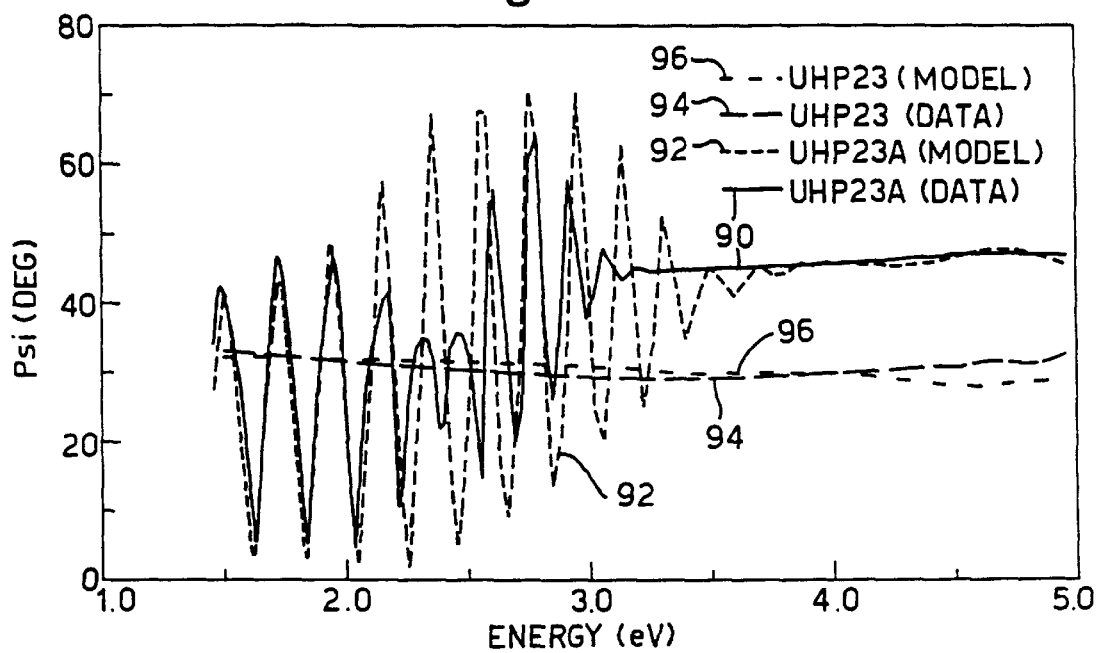
FIG. 9 shows measured data and theoretical model data obtained by spectroscopic ellipsometry for a porous silicon specimen of the invention and a comparison specimen.

Ellipsometric spectroscopy was employed to determine the thickness of the air dried comparison specimen UHP 23 and the supercritically dried specimen UHP 23A. The results are shown in FIG. 9. Ellipsometry is a known technique for optically characterising surfaces and surface films or layers. It involves determining the amplitude ratio (tan ψ) and phase difference (cos Δ) of light beams reflected from a surface under test and p-polarized and s-polarised respectively in relation to that surface. This is carried out over a range of wavelengths. Subsequently the data is fitted to a theoretical model, in which the surface layer's pseudo-refractive indices and thickness are parameters. Porosity is obtainable from comparison with the optical properties of non-porous (bulk) crystalline silicon. See for example Pickering et al., Applied Surface Science 63 (1993) pages 22–26.

In FIG. 9, the ellipsometric amplitude ratio ψ (Psi) in degrees is plotted against photon energy (eV) for UHP 23 (air dried) and UHP 23A (supercritically dried). This is shown in each case both for measured ellipsometry data and for calculations from a theoretical model forming a best fit to such data. The upper right of the drawing gives a key to the graphs shown. The theoretical model employed is a multilayer effective medium model of a kind known in ellipsometry. Graphs 90 (measured data) and 92 (theoretical model) were obtained form supercritically dried specimen UHP 23A shown in FIGS. 4 and 6. The oscillatory behaviour is due to interference fringes, and indicates good optical quality. The theoretical model is a reasonable fit; it overestimates fringe amplitude, probably due porosity gradient and/or non-ideal interfaces. It indicates a thickness of the porous silicon layer of 4.98±0.05 $\mu$m, together with a porosity (percentage void) varying from 97% (surface remote from substrate) to 92% (adjacent to substrate). This is consistent with etching decreasing with penetration depth, which is normal. UHP 23A therefore has a thickness of about 5 $\mu$m and an average porosity of about 95% determined ellipsometrically. The porosity figure of 97% corresponds to the outer or upper 0.25 $\mu$m thickness of the porous silicon 62 in FIG. 6. This porosity is consistent with an average density of 0.09 g/cm$^3$ and a refractive index less than 1.10.

Graphs 94 (measured data) and 96 (theoretical model) were obtained for the air dried comparison specimen UHP 23. They do not show interference fringes, indicating that coherency with the substrate has been lost and that optical quality is poor. The measured data can be fitted with an average porosity of 83% assuming a free standing porous layer; this is consistent with cross-sectional SEM results (see FIG. 5) showing that the porous layer had at least partially lifted off (become detached) from the bulk silicon substrate. The data also indicated a reverse or negative porosity gradient of 80% at the outer surfaces increasing to 85% adjacent to the substrate; this is consistent with collapse of at least part of the porous structure.

The difference between the ellipsometric porosity results for UHP 23 and UHP 23A indicates that the former experienced a shrinkage over 10% relative to the latter. Such shrinkage can be inferred from FIG. 5, in which the porous silicon material contains voids 54 and has a concave upper surface consistent with shrinking during drying. FIG. 6 however demonstrates that such shrinkage is not detectable in supercritically dried specimen UHP 23A. From FIG. 6 it can be seen that the thickness of specimen UHP 23A is constant to within 5% over a distance of 20 $\mu$m measured parallel to the surface of the silicon substrate 64. This thickness is 4.0±0.2 $\mu$m. Over the whole of specimen UHP 23A (area 2 cm$^2$), porous silicon thickness variation was less than 10%. This compares with a variation in thickness of air dried specimen UHP 23 which approaches 100%; ie the thickness varies between about 4 $\mu$m and less than 0.1 $\mu$m due to voids 56 in the porous silicon material of this specimen. The voids 56 extend virtually down to the substrate 54, and the near 100% thickness variation occurs over distances of only a few $\mu$m between adjacent voids 56.

Supercritical drying is known per se for the production of aerogels, these being structures which are over 90% porous and the pores are air filled. Tewari et al. describe the production of transparent silica aerogels in Materials Letters, Vol. 3, No. 9, 10 pages 363 to 367, July 1985. The silica aerogel is produced from a solution by a sol-gel process; the process involves hydrolysis and polycondensation of silicon alkoxides in alcohol, which produces an alcogel (ie alcohol-filled pores). The aerogel is produced by replacing the alcohol in the pores by air. This is done by supercritical drying. The silica aerogels are non-crystalline and are free standing, ie there is no supporting substrate. They are insulators not semiconductors, and Tewari et al. do not disclose luminescence properties.

Supercritical drying for the production of silica aerogels is also disclosed by Rangarajan and Lira, J. Supercritical Fluids, Vol 4, No. 1, pages 1 to 7, 1991. The original work in this field was carried out by Kistler in 1932, and is reported in J. Phys. Chem 1932, 36, 52. Published Japanese Patent Application Number JP 890266463 describes a method of drying semiconductor substrates using supercritical drying techniques to give increased yield through the avoidance of attaching foreign matter to the substrate.

Semiconductor processing is a high technology field with considerable research and development activity in many countries. Semiconductor processing is directed to layers or strata supported by bulk (non-porous) wafer substrate. Layers grown epitaxially on a substrate are extensions of the substrate's crystal structure, ie a substrate and semiconductor layers thereon from a single crystal. The layers are of microscopic thickness, typically a few $\mu$m in thickness or less down to a fraction of a $\mu$m. A porous silicon "layer" is a skeleton structure formed by etching to remove material from a silicon wafer to which the skeleton is attached. It is referred to in this specification, as an aerocrystal or aerocrystal network, and is an extension of a non-porous crystalline substrate. Pores in the porous silicon terminate at the wafer. Aerogels are formed by condensation from solution, not from an original non-porous solid phase material. An aerogel therefore has no substrate of such original material, and all its surfaces are porous. Aerogels are amorphous, ie non-crystalline; they are of macroscopic dimensions, mm or cm in thickness, as opposed to $\mu$m thicknesses for semiconductor layers.

In a textbook, "Chemical Processing of Advanced Materials", pp 19 onwards, Ed. Hench and West, 1992, John Wiley and Sons, Hrubesh et al. describe the production of very high porosity silica aerogels. They observe that such aerogels are hydrophobic if produced by direct extraction of solvent, and are stable in atmosphere. However, silica aerogels are hydrophilic when produced by first exchanging the solvent with carbon dioxide and supercritically drying. They shrink badly when exposed to air. This has surprisingly been found not to be the case for supercritically dried porous silicon. It is also surprising that the high pressures involved in supercritical drying have not produced any serious etching effects associated with the solvent being displaced from porous silicon. In this regard it is observed that alcohols in porous silicon are associated with heat evolution indicating etching. This is reported by Canham and Groszek in J. Appl. Phys. Vol 72 (4), pages 1558–1564, Aug. 15, 1992.

The supercritical drying process may also be used to fabricate thick luminescent porous silicon layers which are of the order of 200 µm in thickness. Such layers having a porosity of greater than 70% averaged over the depth of the porous layer have been produced and their luminescence properties characterized.

Figure 10:
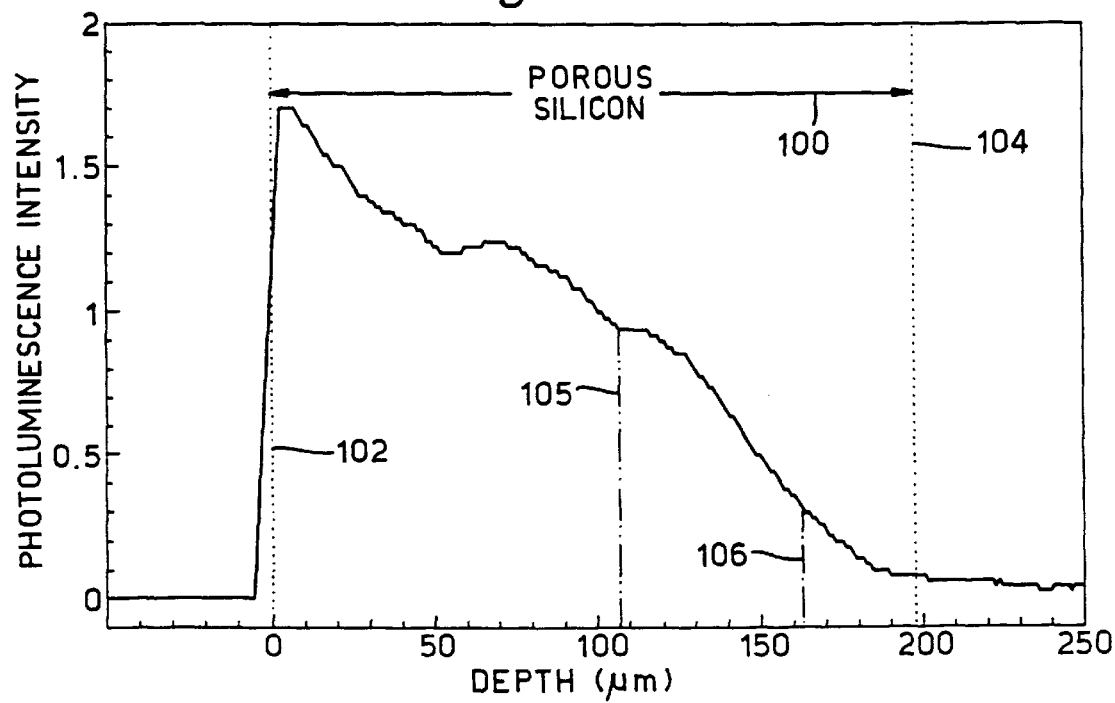
FIG. 10 shows photoluminescence data from a porous silicon specimen of the invention.

Referring now to FIG. 10, there is shown in graphical form a plot of luminescence intensity in arbitrary units versus depth for a cross-section of a thick luminescent porous silicon layer. The thick luminescent porous silicon layer was fabricated by the following method. A wafer of silicon material heavily doped with arsenic to form a $n^+$ wafer, with a resistivity in the range $5 \times 10^{-3}$ ohm cm to $10 \times 10^{-3}$ ohm cm was used to produce the very thick porous layer. The wafer was anodized in a 20% ethanoic HF solution, comprising a 1:1 ethanol:40 wt % HF solution, at 50 mAcm$^{-2}$ for 90 minutes. The wafer was then subjected to a chemical etch in the same solution for 2 hours. Following the etching process, the wafer was removed from the HF solution and immersed in isopropyl alcohol (IPA) whilst still wet. The wafer was kept immersed in the IPA for 18 hours prior to commencement of the supercritical drying process. The supercritical drying was carried out in a similar manner to that described earlier in relation to FIG. 2 except that that IPA rather than ethanol was used as the intermediate solvent. Segments of the wafer were dried in a 50 cm$^3$ pressure vessel which was flushed with liquid $CO_2$ at a temperature of 18° C. and a pressure of 10.1 MPa with a flow rate of 5 cm$^3$ min$^{-1}$ for 80 minutes to remove most of the IPA. The temperature was then raised at a rate of 2° C. min$^{-1}$ to 40° C. and the sample flushed with supercritical $CO_2$ for 50 minutes. The pressure vessel was then de-pressurized at 40° C. over a period of 10 minutes. The wafer segment had a porous silicon layer approximately 200 µm thick with a porosity of greater than 70% throughout the entire depth of the layer. The porosity was measured using a gravimetric technique. After supercritical drying, the wafer segment was stored in ambient air for 47 days prior to luminescence measurements being performed.

FIG. 10 was obtained using measurement techniques as described by Beale et al. in Materials Research Society Symposium Proceedings, Volume 283, 1993, pages 377-382. A cross-section of the porous silicon layer was illuminated using a 442 nm HeCd laser and the intensity of the resulting visible photoluminescence was measured as a function of position across the porous silicon layer. The extent of the porous silicon region is indicated by an arrow 100, with the porous silicon region having top and bottom surfaces corresponding to doffed lines 102 and 104 respectively. FIG. 10 shows that photoluminescence was achieved throughout the porous silicon layer, with the luminescence intensity decreasing with increasing depth. The efficiency of the luminescence was measured for the top porous silicon surface, i.e. the surface furthest from the silicon wafer, corresponding to dotted line 102 at a depth of 0 µm in FIG. 10. The measured external power efficiency was 0.54%. Using this value for luminescence efficiency at the porous silicon top surface, it is possible to calibrate FIG. 10. The luminescence efficiency falls below 0.3% at a depth indicated by a chain line 105, indicating that the porous silicon has a luminescence efficiency of more than 0.3% over more than 100 µm, or 50% of the porous silicon thickness. The luminescence efficiency falls below 0.1% at a depth indicated by a chain line 106, indicating that the porous silicon has a luminescence efficiency of greater than 0.1% over more than 160 µm, or 80% of the porous silicon thickness. The porous silicon layer therefore has more than 80% of its thickness exhibiting good luminescence properties. The combination of the thick porous silicon layer and the illuminating laser comprises a luminescent device. The wafer was examined in an SEM and was found to have good structural integrity, with no evidence of cracking of the porous silicon layer being observed in a sample measuring 2 cm by 4 cm.

Thick photoluminescent porous silicon with a thickness of 32±5 µm and good structural integrity, showing no evidence of cracking under scanning electron microscopy has also been fabricated from lightly doped p-type (p$^-$) silicon. A cz p$^-$ silicon wafer of resistivity in the range 1–3 ohm cm was anodized in a 20% ethanoic HF solution for 90 minutes at 20 mAcm$^{-2}$. The anodized wafer was then immersed in IPA whilst still wet. The wafer was then dried supercritically in the same manner as for the 200 µm thick sample described previously. Visible photoluminescence was observed across the entire porous silicon layer under cross-sectional flood illumination with 442 nm radiation. When illuminated with 325 nm ultraviolet radiation, the porous silicon luminesced with a peak wavelength of 575 nm. The efficiency of the photoluminescence was measured to be more than 1% extending over a thickness of greater than 20 µm.

Thick porous silicon layers have been observed previously. N. Ookubo et al. in Material Science and Engineering B20 (1993) pp 324 to 327 reported the production of porous silicon films having a thickness of up to 94 µm. However, the films produced by Ookubo et al. have a layered structure, with only a top layer of thickness 6–8 µm being described as visibly photoluminescent. The top surface of the Ookubo films are shown as being cracked into cells with a lateral dimension of approximately 10 µm. In another paper by Ookubo in J. Appl. Phys 74 (10), Nov. 15, 1993, pp 6375 to 6382, describing a two-layer structure of approximately 8 µm in thickness, the layer structure is attributed to the process of removing the electrolyte after anodization. Grivickas et al. in their paper referenced earlier also observed a layered structure to their porous silicon films under scanning electron microscopy. These films were up to 50 µm thick and are described as being weakly photoluminescent but again showed cracking. It seems probable that the layered structure is a result of the top layer having higher porosity which collapses when the sample is dried. It is desirable to be able to form luminescent porous silicon layers of thickness greater than 10 µm which do not have a layered structure. It is also desirable to form luminescent porous silicon layers of thickness greater than 10 µm which do not exhibit cracking. Neither the 200 µm thick n$^+$ porous silicon layer nor the 32 µm thick p$^-$ porous silicon layer exhibited a layer structure under cross-sectional scanning electron microscopy. Also, neither the 200 µm thick n$^+$ porous silicon layer nor the 32 µm thick p$^-$ porous silicon layer exhibited voids, crazing or peeling during examination by scanning electron microscopy at a magnification of 7,000.

Whereas the invention is particularly relevant to porous silicon, it is also relevant to other porous semiconductor materials such as porous gallium arsenide.

I claim:

1. Porous semiconductor material which is at least partly crystalline, wherein the semiconductor material has a porosity in excess of 90% determined gravimetrically and in which voids, crazing and peeling are substantially not observable by scanning electron microscopy at a magnification of 7,000, wherein the porous semiconductor material is porous silicon material.

2. Material according to claim 1, wherein the material is at least 80% crystalline.

3. Material according to claim 3, wherein the material is connected to a non-porous silicon substrate.

4. Material according to claim 1, wherein the material is connected to a non-porous silicon substrate.

5. Material according to claim 1, wherein the material contains silicon quantum wires with diameters less than 4 nm.

6. Material according to claim 5, wherein at least 90% by volume of the material consists of a reticulated structure of silicon quantum wires and at least 50% of the said wires have diameters less than 4 nm.

7. Material according to claim 6, wherein the material is at least 80% crystalline.

8. Material according to claim 1, wherein the material is in the form of an aerocrystal connected to a non-porous crystalline silicon substrate wherein the aerocrystal and the substrate have the same crystal structure.

9. Material according to claim 1, wherein the material is activatable to produce visible luminescence.

10. Material according to claim 2, wherein the material is in the form of an aerocrystal connected to a non-porous crystalline substrate of the same semiconductor material.

11. Porous semiconductor material, wherein the porous semiconductor material comprises an aerocrystal of greater than 90% porosity connected to a substantially non-porous substrate of the same material and crystal structure, and that part of the aerocrystal has a refractive index less than 1.1, said material comprising silicone.

12. Porous semiconductor material which is at least partly crystalline, wherein the semiconductor material has a porosity in excess of 90% determined gravimetrically and has a crack density of less than $10^8$ cm$^{-2}$, said material comprising silicone.

13. Porous semiconductor material wherein the porous semiconductor material comprises an aerocrystal of greater than 90% porosity connected to a substantially non-porous substrate of the same material and crystal structure, the material being free of cracks greater than 0.1 $\mu$m in width, said material comprising silicone.

14. Porous semiconductor material which is at least partly crystalline, wherein the semiconductor material has a porosity in excess of 90% determined gravimetrically and in which voids (56), crazing and peeling are substantially not observable by scanning electron microscopy at a magnification of 7,000 of an area of at least 20 $\mu$m×10 $\mu$m, said material comprising silicone.

15. Porous semiconductor material which is at least partly crystalline, wherein the semiconductor material has a porosity in excess of 90% determined gravimetrically and is free of cracks greater than 0.1 $\mu$m in width, said material comprising silicone.

16. A luminescent device incorporating porous semiconductor material which is at least partly crystalline and activatable to produce visible luminescence, wherein the porous semiconductor material (12) has a porosity in excess of 90% determined gravimetrically and in which voids, crazing and peeling are substantially not observable by scanning electron microscopy at a magnification of 7,000, the device also incorporating means for exciting luminescence from the porous semiconductor material, said material comprising silicone.

17. A device according to claim 16, wherein the porous silicon material is at least 80% crystalline.

18. A device according to claim 16, wherein the porous silicon material contains silicon quantum wires with diameters less than 4 nm.

19. A device according to claim 18, wherein at least 90% by volume of the porous silicon material consists of a reticulated structure of silicon quantum wires and at least 50% of the said wires have diameters less than 4 nm.

20. A device according to claim 16, wherein the porous silicon material is connected to a non-porous crystalline silicon substrate.

21. A luminescent device incorporating porous semiconductor material which is at least partly crystalline and activatable to produce visible luminescence, wherein the porous semiconductor material has a porosity in excess of 90% determined gravimetrically and in which voids, crazing and peeling are substantially not observable by scanning electron microscopy at a magnification of 7,000 of an area of at least 20 $\mu$m×10 $\mu$m, the device also incorporating means for exciting luminescence from the porous semiconductor material, said material comprising silicone.

22. A method of making porous semiconductor material incorporating the step of producing porous semiconductor material which is liquid-wetted and at least partly crystalline, the method further incorporates the step of drying the porous semiconductor material by a supercritical drying process, wherein the step of producing porous semiconductor material which is liquid-wetted and at least partly crystalline involves producing porous semiconductor material which is porous silicon material with a porosity in excess of 90% determined gravimetrically.

23. A method according to claim 22, wherein the step of producing porous semiconductor material which is liquid-wetted and at least partly crystalline involves an electrochemical process to produce porous silicon material.

24. A method according to claim 23, wherein after drying the porous silicon material has at least 80% crystallinity, porosity in excess of 90% determined gravimetrically, and voids, crazing and peeling are not observable by scanning electron microscopy at a magnification of 7,000.

25. A method according to claim 24, wherein after drying at least 90% by volume of the porous silicon material consists of a reticulated structure of silicon quantum wires and at least 50% of the said wires have diameters less than 4 nm.

26. A method according to claims 22, wherein the supercritical drying process involves replacement of liquid in the pores of the porous semiconductor material by liquid $CO_2$ and a subsequent change of the $CO_2$ phase from liquid to gas.

27. A method of making porous semiconductor material according to claim 22, wherein after drying the porous semiconductor material is activatable to produce visible luminescence.

28. A method according to claim 22, wherein the porous semiconductor material has a sheet thickness greater than 10 $\mu$m.

29. A method according to claim 28, wherein the material has a sheet thickness greater than 100 $\mu$m.

30. A method according to claim 28, wherein the material has a sheet thickness in the range 20 $\mu$m to 200 $\mu$m.

31. Porous semiconductor material produced by the method of claim 22.

32. A method of making porous semiconductor material incorporating the step of producing porous semiconductor material which is liquid-wetted and at least partly crystalline, the method further incorporates the step of drying the porous semiconductor material by a supercritical drying process, wherein the step of producing porous semiconductor material which is liquid-wetted and at least partly crystalline involves producing porous semiconductor material which is porous silicon material with a porosity in excess of 90% determined gravimetrically, wherein the step of producing porous semiconductor material which is liquid-wetted and at least partly crystalline involves an electrochemical process to produce porous silicon material, wherein the step of producing porous semiconductor material which is liquid-wetted and at least partly crystalline involves an anodization/etching process to produce porous silicon material connected to a substantially non-porous crystalline silicon substrate.

33. A method according to claim 32, wherein the anodization/etching process comprises anodizing a substantially non-porous crystalline silicon substrate to produce porous and at least partly crystalline silicon material connected thereto, and etching the porous silicon material to increase its porosity, etching being terminated with the porous silicon material in a liquid-wetted state for drying by the supercritical drying process.

* * * * *